United States Patent
Jung et al.

(10) Patent No.: US 9,536,578 B2
(45) Date of Patent: Jan. 3, 2017

(54) APPARATUS AND METHOD FOR WRITING DATA TO MEMORY ARRAY CIRCUITS

(71) Applicant: QUALCOMM Incorporated, San Diego, CA (US)

(72) Inventors: Chulmin Jung, San Diego, CA (US); Changho Jung, San Diego, CA (US); Sei Seung Yoon, San Diego, CA (US); Rakesh Vattikonda, San Diego, CA (US); Nishith Desai, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 467 days.

(21) Appl. No.: 13/863,989

(22) Filed: Apr. 16, 2013

(65) Prior Publication Data

US 2014/0269112 A1    Sep. 18, 2014

Related U.S. Application Data

(60) Provisional application No. 61/792,298, filed on Mar. 15, 2013.

(51) Int. Cl.
  *G11C 7/12* (2006.01)
  *G11C 7/10* (2006.01)
  *G11C 11/419* (2006.01)

(52) U.S. Cl.
  CPC .............. *G11C 7/12* (2013.01); *G11C 7/1084* (2013.01); *G11C 7/1096* (2013.01); *G11C 11/419* (2013.01)

(58) Field of Classification Search
  CPC ....... G11C 7/12; G11C 7/1096; G11C 7/1084; G11C 11/419
  See application file for complete search history.

(56) References Cited

U.S. PATENT DOCUMENTS

| | | | |
|---|---|---|---|
| 5,155,392 A | 10/1992 | Nogle | |
| 5,933,386 A | 8/1999 | Walker et al. | |
| 6,437,627 B1 | 8/2002 | Tran et al. | |
| 7,023,738 B2 | 4/2006 | Vimercati et al. | |
| 7,317,335 B2 | 1/2008 | Min et al. | |
| 2004/0130926 A1* | 7/2004 | Nakase | G11C 7/06 365/145 |
| 2006/0186921 A1* | 8/2006 | Chen | H03K 19/0013 326/58 |
| 2011/0149667 A1* | 6/2011 | Hamzaoglu | G11C 11/412 365/203 |
| 2013/0128655 A1* | 5/2013 | Cheng | G11C 8/10 365/154 |

* cited by examiner

*Primary Examiner* — Douglas King
(74) *Attorney, Agent, or Firm* — Arent Fox LLP

(57) ABSTRACT

A write driver for a memory circuit includes a control circuit configured to: operate a first push-pull driver to generate a first drive signal in a first voltage domain at a first node based on an input signal in a second domain and in response to a mode select signal being in a first mode, wherein the first drive signal is at a same logic level as the input signal; operate a second push-pull driver to generate a second drive signal in the first voltage domain at a second node based on the input signal and in response to the mode select signal being in the first mode, wherein the second drive signal is at a complement logic level with respect to the input signal; and operate the first and second push-pull drivers to float the first and second nodes in response to the mode select signal being in a second mode.

33 Claims, 7 Drawing Sheets

| | Din (CX) | Din1 (CX) | Din2 (CX) | Din1 (MX) | Din1_n (MX) | Din2 (MX) | Din2_n (MX) | GDin | Gdin_n |
|---|---|---|---|---|---|---|---|---|---|
| MODE SELECT 2 | X | L | L | L | H | L | H | FLOAT | FLOAT |
| MODE SELECT 1 | L | L | H | L | H | H | L | L | H |
| | H | H | L | H | L | L | H | H | L | ns
APPARATUS AND METHOD FOR WRITING DATA TO MEMORY ARRAY CIRCUITS

CROSS-REFERENCE TO A RELATED APPLICATION

This application claims the benefit of the filing date of Provisional Application, Ser. No. 61/792,298, filed on Mar. 15, 2013, and entitled "Apparatus and Method for Writing Data to Memory Array Circuits," which is incorporated herein by reference.

FIELD

The present disclosure relates generally to memory circuits, and more specifically, to an apparatus and method for writing data to a memory array circuit.

BACKGROUND

There are many types of memory circuits, such as static read access memory (SRAM), dynamic read access memory (DRAM), electrically erasable read only memory (EE-PROM), flash memory, and other types of memory circuits. These memory circuits typically comprise a plurality of memory cells organized in a two-dimensional array. The memory cells are accessed by way of parallel word lines extending along one dimension (e.g., along the rows) of the memory array, and bit lines extending along an orthogonal dimension (e.g., along the columns) of the memory array. A particular memory cell is typically accessed by activating or applying a particular voltage to a word line coupled to that cell, and sensing a response from or applying another particular voltage to a bit line coupled to that cell.

In particular, with regard to writing data to a memory cell of a memory array circuit, a write driver is typically employed for writing data to cells in a particular column. The write driver is coupled to the bit line and the complementary bit line pertaining to a column of cells. When a data value of one (1) is to be written to a particular cell belonging to a column of cells, the word line coupled to the cell is activated. This has the effect of coupling the corresponding bit line and corresponding complementary bit line to the cell. The write driver is also activated to generate a logic high signal on the corresponding bit line, and a logic low signal on the corresponding complementary bit line. If the cell previously stored a data value of zero (0), the cell would change state and store a data value of one (1) in response to the bit line and the complementary bit line being driven to logic high and logic low, respectively. If, on the other hand, the cell previously stored a data value of one (1), the state of the cell would remain unchanged. The writing of a data value of zero (0) operates in a similar manner, except that the write driver generates a logic low signal on the corresponding bit line, and a logic high signal on the corresponding complementary bit line.

Often, the memory array circuit is incorporated into an integrated circuit along with other types of circuitry that may need interface to (e.g., read data from or write data to) with the memory array circuit. Generally, the logic level voltages required by the write driver to write data to memory cells are typically higher than the logic level voltages used by other types of circuitry on the same integrated. Accordingly, the write driver should be configured to level shift the voltages used by the other circuitry from a lower voltage domain to a higher voltage domain suitable for writing data to the memory array circuit.

Additionally, the write driver should not interfere or minimally interfere with the corresponding bit line and complementary bit line when no data is being written to a cell in the associated column. For instance, when data is read from a cell through the use of a sense amplifier, the write driver should not affect the ability of the sense amplifier to sense the voltage or data value stored in the cell. Accordingly, the write driver should be configured to substantially not interfere with the corresponding bit line and complementary bit line during times when no data is being written to a memory cell.

SUMMARY

An aspect of the disclosure relates to an apparatus comprising a first push-pull driver, a second push-pull driver, and a control circuit. The control circuit is configured to operate the first push-pull driver to generate a first drive signal in a first voltage domain at a first node based on an input signal and in response to a mode select signal being in a first mode, wherein the input signal is in a second voltage domain, and wherein the first drive signal is at a same logic level as the input signal. The control circuit is further configured to operate the second push-pull driver to generate a second drive signal in the first voltage domain at a second node based on the input signal and in response to the mode select signal being in the first mode, wherein the second drive signal is at a complement logic level with respect to the input signal. Additionally, the control circuit is configured to operate the first and second push-pull drivers to float the first and second nodes in response to the mode select signal being in a second mode.

In another aspect of the disclosure, the first push-pull driver comprises a first transistor and a second transistor coupled in series between a first voltage rail and a second voltage rail, wherein the first node is situated between the first and second transistors, and wherein the first and second transistors comprise first and second control inputs, respectively. In yet another aspect, the second push-pull driver comprises a third transistor and a fourth transistor coupled in series between the first voltage rail and the second voltage rail, wherein the second node is situated between the third and fourth transistors, and wherein the third and fourth transistors comprise third and fourth control inputs, respectively. In still another aspect, the first and third transistors are p-channel field effect transistors (FETs) and the second and fourth transistors are n-channel FETs, and wherein the first, second, third and fourth control inputs are the gates of the first, second, third, and fourth transistors, respectively.

In another aspect of the disclosure, the control circuit comprises a first level shifter configured to generate a first set of complementary control signals in the first voltage domain based on a first intermediate signal in the second voltage domain, wherein the first intermediate signal is at the same logic level as the input signal in response to the mode select signal being in the first mode, wherein the first intermediate signal is at a low logic level in response to the mode select signal being in the second mode, and wherein one of the first set of complementary control signals that is at a complement logic level with respect to the first intermediate signal is coupled to the first control input of the first transistor.

In another aspect of the disclosure, the control circuit comprises a second level shifter configured to generate a second set of complementary control signals in the first voltage domain based on a second intermediate signal in the second voltage domain, wherein the second intermediate signal is at a complement logic level with respect to the input signal in response to the mode select signal being in the first mode, wherein the second intermediate signal is at a low logic level in response to the mode select signal being in the second mode, and wherein one of the second set of complementary control signals that is at a complement logic level with respect to the second intermediate signal is coupled to the third control input of the third transistor.

In another aspect of the disclosure, the first intermediate signal is coupled to the fourth control input of the fourth transistor, and wherein the second intermediate signal is coupled to the second control input of the second transistor. In yet another aspect, the other of the first set of complementary control signals that is at the same logic level as the first intermediate signal is coupled to the fourth control input of the fourth transistor, and wherein the other of the second set of complementary control signals that is at the same logic level as the second intermediate signal is coupled to the second control input of the second transistor.

In another aspect of the disclosure, the control circuit comprises an input signal mode selector configured to generate the first intermediate signal based on the input signal and the mode select signal, and generate the second intermediate signal based on the input signal and the mode select signal. In yet another aspect, the input signal mode selector comprises a first gating device configured to generate the first intermediate signal by gating the input signal in response to the mode select signal being in the first mode, and generate the first intermediate signal at a low logic level in response to the mode select signal being in the second mode; an inverter configured to generate a complement of the input signal; and a second gating device configured to generate the second intermediate signal by gating the complement input signal in response to the mode select signal being in the first mode, and generate the second intermediate signal at a low logic level in response to the mode select signal being in the second mode. In still another aspect, the first and second gating devices comprise first and second NOR-gates, respectively.

In another aspect of the disclosure, the first and second nodes of the first and second push-pull drivers are coupled to complementary bit lines of a memory circuit. In yet another aspect, the mode select signal comprises a write clock signal for timely controlling a writing of data to the memory circuit.

Other aspect of the disclosure relates to apparatus, components, modules, devices, encoded computer-readable storage mediums, and other elements configured to achieve the operations in accordance with the aforementioned method. In general, other aspects, advantages and novel features of the present disclosure will become apparent from the following detailed description of the disclosure when considered in conjunction with the accompanying drawings.

The word "exemplary" is used herein to mean "serving as an example, instance, or illustration." Any aspect described herein as "exemplary" is not necessarily to be construed as preferred or advantageous over other aspects."

DETAILED DESCRIPTION

Various aspects of the disclosure are described below. It should be apparent that the teachings herein may be embodied in a wide variety of forms and that any specific structure, function, or both being disclosed herein are merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Figure 1:
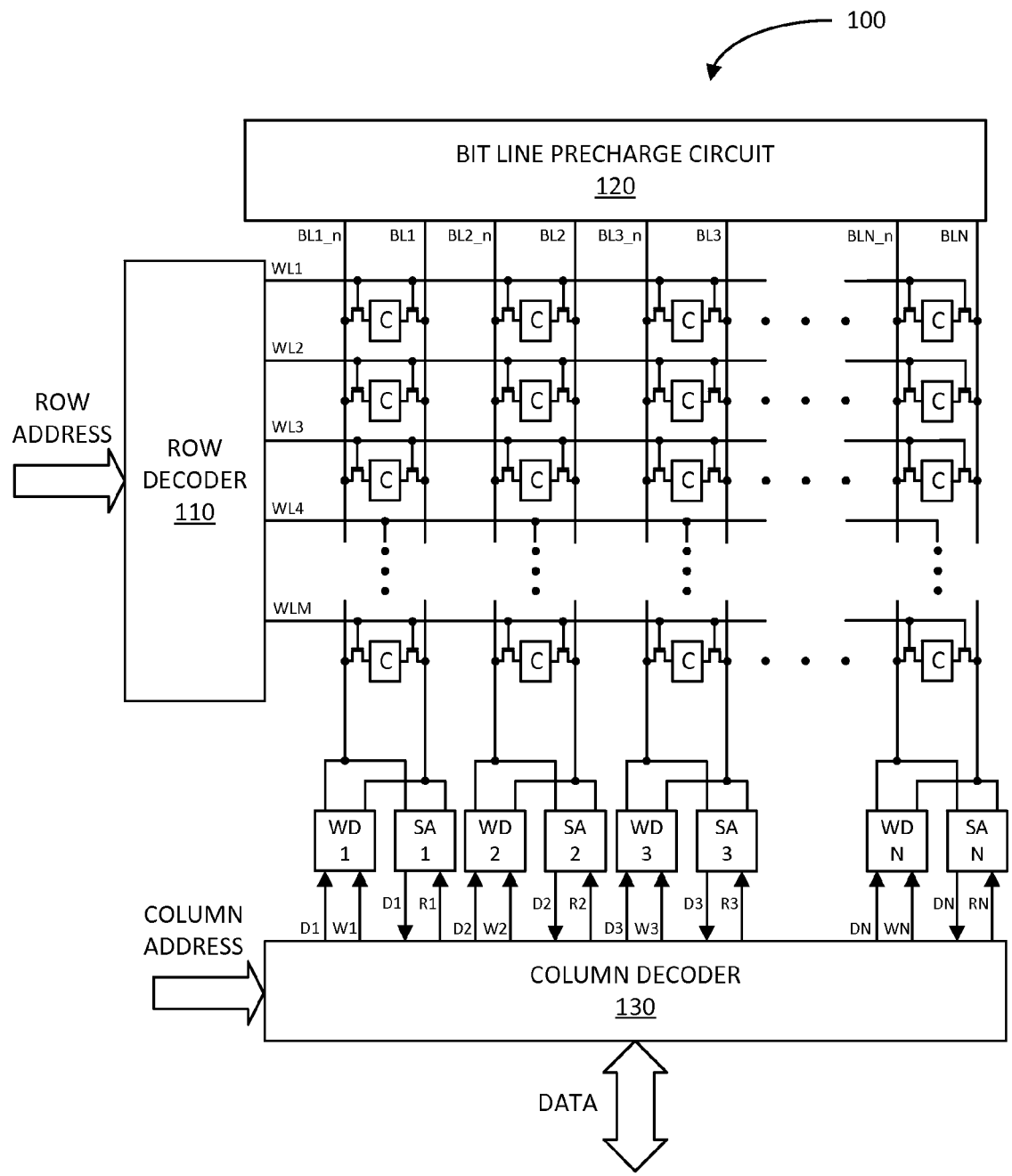
FIG. 1 illustrates a block diagram of an exemplary memory circuit in accordance with an aspect of the disclosure.

FIG. 1 illustrates a block diagram of an exemplary memory circuit 100 in accordance with an aspect of the disclosure. The memory circuit 100 comprises a plurality of memory cells C organized in a two-dimensional array, such as along M rows and N columns, wherein M and N are integers. Memory cells C common to a row are coupled to a corresponding word line. For instance, for the M rows of memory cells C, there are M word lines WL1 to WLM. Memory cells C common to a column are coupled to corresponding bit line and complementary bit line. For instance, for the N columns of memory cells C, there are N pairs of non-complementary and complementary bit lines BL1-BL1_n to BLN-BLN_n.

The memory circuit 100 further comprises a row decoder 110 configured to select one of the word lines WL1 to WLM based on an input row address. More specifically, the row decoder 110 is configured to select a word line by applying a voltage on the word line that causes access switching devices or transistors (e.g., field effect transistors (FETs)) to turn on, and electrically couple the bit lines and complementary bit lines to the memory cells C associated with the selected word lines.

The memory circuit 100 further comprises a bit line precharge circuit 120 configured to precharge (e.g., apply a defined voltage) to the bit lines during a read operation. Additionally, the memory circuit 100 comprises a column decoder 130 configured to select one or more sense amplifiers SA1 to SAN via corresponding select signals R1 to RN during a read operation based on an input column address. The selected one or more sense amplifiers SA1 to SAN generate the data D1 to DN read from the memory cells C coupled to the selected word line. The column decoder 130 is configured to produce the read data at an output port thereof.

The column decoder 130 is also configured to select one or more write drivers WD1 to WDN via corresponding select signals W1 to WN during a write operation based on the input column address. Also, during a write operation, the column decoder 130 is configured to receive the data to be written via the data port, and apply the data D1 to DN to corresponding inputs of the write drivers WD1 to WDN. Based on the data, the write drivers WD1 to WDN apply the corresponding voltages to the bit line pairs BL1-BL1_n to BLN-BLN_n in order to effectuate the writing of the data to memory cells C coupled to the selected word line.

In summary, during a read operation, the bit line precharge circuit 130 precharges the bit lines BL1-BL1_n to BLN-BLN_n with a defined voltage (e.g., VDD/2). After the bit lines BL1-BL1_n to BLN-BLN_n are precharged, the row decoder 110 applies a defined voltage to a selected one of the word lines WL1 to WLM based on the input row address. This couples the memory cells C associated with the activated word line to the corresponding bit lines. Once the bit lines are coupled to the selected memory cells, transfer of charges occur that result in the bit lines attaining voltages based on the value of the data of the corresponding memory cells C. For example, if the value of the data stored by a cell is a logic one (1), then the corresponding bit line and complementary bit line are at high and low logic voltage levels, respectively. Conversely, if the value of the data stored by a cell is a logic zero (0), then the corresponding bit line and complementary bit line are at low and high logic voltage levels, respectively. The column decoder 130 activates one or more sense amplifiers SA1 to SAN based on the input column address, which causes the activated sense amplifiers SA1 to SAN to generate the data D1 to DN based on the voltages on the corresponding bit lines. The column decoder 130 outputs the read data D1 to DN to the data port for access by one or more external devices.

During a write operation, the column decoder 130 receives the data to be written from an external device via the data port. The column decoder 130 routes the data D1 to DN to the corresponding write drivers WD1 to WDN. The column decoder 130 then selects one or more write drivers WD1 to WDN via the select signals W1 to WN based on the input column address. In response to the one or more select signals W1 to WN, the selected write drivers WD1 to WDN apply corresponding drive voltages to the corresponding bit lines BL1-BL1_n to BLN-BLN_n based on the corresponding data D1 to DN. For example, if the value of the data to be written to a cell is a logic one (1), then the write driver applies high and low drive voltage levels to the corresponding bit line and complementary bit line, respectively. Conversely, if the value of the data to be written to a cell is a logic zero (0), then the write driver applies low and high drive voltage levels to the corresponding bit line and complementary bit line, respectively. The row decoder 110 then applies a defined voltage to the selected word line based on the input row address. The selected word line couples the corresponding bit lines to the memory cells C, which causes the memory cells C to be written with the corresponding data.

As previously discussed, in order to write data to a memory cell, a corresponding write driver needs to generate the appropriate drive voltages on the corresponding bit line and complementary bit line based on the data. Generally, the appropriate drive voltages are typically in a voltage domain different (e.g., higher) than a voltage domain of the data applied to the write driver. Accordingly, the write driver needs to level shift the voltage associated with the input data from its domain to the domain necessary to write data to the corresponding memory cell C. Additionally, during times when no data is being written into memory cells, the write drivers should not affect other operations associated with the memory cells, such as a read operation. Accordingly, the following describes various examples of write drivers capable of performing the necessary voltage level shift during a write operation, and to substantially isolate the write drivers from the bit lines during non-writing intervals.

Figures 2A, 2B:
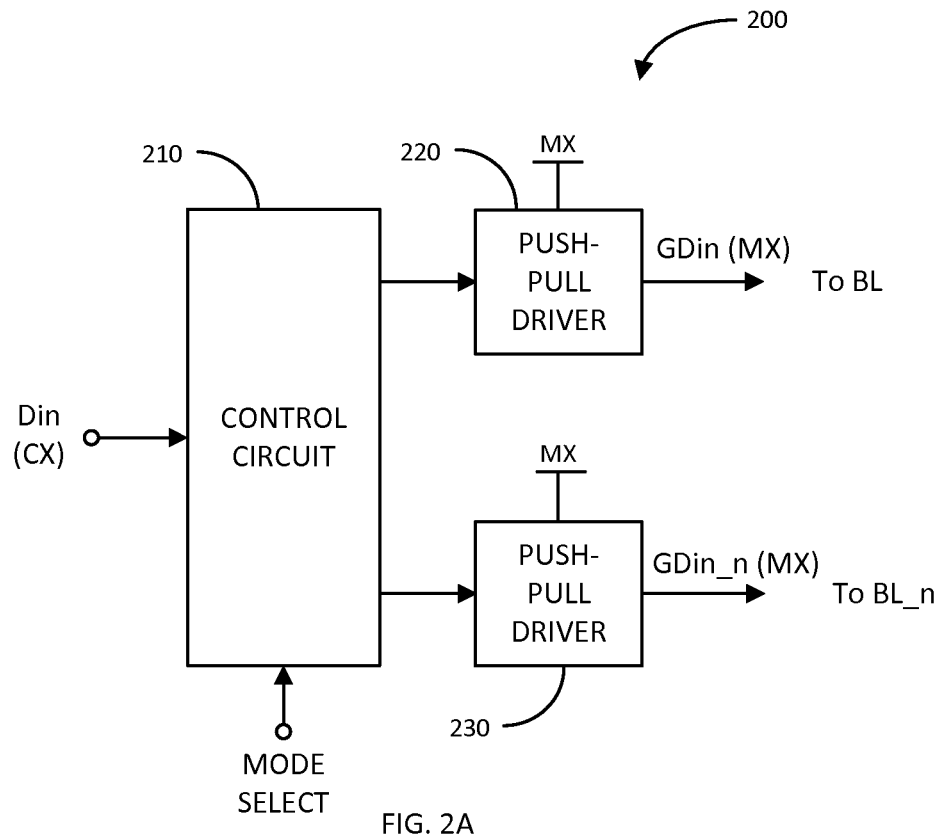
FIG. 2A illustrates a block diagram of an exemplary write driver for a memory circuit in accordance with another aspect of the disclosure.
FIG. 2B illustrates a table of exemplary signal states associated with an operation of the exemplary write driver of FIG. 2A in accordance with another aspect of the disclosure.

FIG. 2A illustrates a block diagram of an exemplary write driver 200 for a memory circuit in accordance with another aspect of the disclosure. The write driver 200 comprises a control circuit 210, a first push-pull driver 220, and a second push-pull driver 230. The control circuit 210 is configured to operate the first and second push-pull drivers 220 and 230 based on an input data signal Din and a mode select signal. The input data signal Din is in a core voltage domain CX. The first push-pull driver 220 has a first output node coupled to a corresponding bit line BL of a memory array circuit, and the second push-pull driver 230 has a second output node coupled to a corresponding complementary bit line BL_n of the memory array circuit.

In operation, when the mode select signal is in a first mode or a write mode, the control circuit 210 is configured to operate the first push-pull driver 220 to generate, at the first output node, a first drive signal GDin in a second memory voltage domain MX that is at the same logic level as the input data signal Din. For instance, if the input data signal Din is at a logic one (1) voltage level in the CX domain, the first drive signal GDin is at a logic one (1) voltage level in the MX domain. Conversely, if the input data signal Din is at a logic zero (0) voltage level in the CX domain, the first drive signal GDin is at a logic zero (0) voltage level in the MX domain. The MX voltage domain is suitable for writing data to the corresponding memory cells C. The CX voltage domain may be associated with logic operations implemented by the column decoder or other circuitry that interfaces with the memory circuit.

Similarly, when the mode select signal is in the first or write mode, the control circuit 210 is configured to operate the second push-pull driver 230 to generate, at the second output node, a second drive signal GDin_n in the second voltage domain MX that is at a complement logic level with respect to the input data signal Din. For instance, if the input data signal Din is at a logic one (1) voltage level in the CX domain, the second drive signal GDin_n is at a logic zero (0) voltage level in the MX domain. Conversely, if the input data signal Din is at a logic zero (0) voltage level in the CX domain, the second drive signal GDin_n is at a logic one (1) voltage level in the MX domain. Thus, the control circuit 210 is configured to perform the appropriate voltage level shift during write operations.

When the mode select is in a second mode or a non-writing mode, the control circuit 210 is configured to operate both the first and second push-pull drivers 220 and 230 to float the first and second output nodes, regardless of the value of the input data signal Din. The first and second push-pull drivers 220 and 230 float the corresponding output nodes by isolating them from the corresponding voltage rails. For instance, when one of the push-pull drivers generates a logic high drive signal, it couples a positive voltage rail to the output node, and isolates the output node from the ground or negative voltage rail. Conversely, when one of the push-pull drivers generates a logic low drive signal, it couples the ground or negative voltage rail to the output node, and isolates the output node from the positive voltage rail. When one of the push-pull drivers floats the corresponding output node, it isolates the output node from both the positive and ground or negative voltage rails. This causes the output node to exhibit relatively high impedance, which effectively isolates the write driver 200 from the corresponding bit line BL and complementary bit line BL_n.

FIG. 2B illustrates a table of exemplary signal states associated with the operation of the write driver 200 in accordance with another aspect of the disclosure. The table summarizes what was previously discussed with respect to the write driver 200. That is, when the mode select signal is in the second or non-writing mode, the control circuit 210 is configured to operate the first and second push-pull drivers 220 and 230 to float their respective output nodes, regardless of the value of the input data signal Din. When the mode select signal is in the first or writing mode, the control circuit 210 is configured to operate the first push-pull driver 220 to generate the first drive signal GDin at the same logic level as the input data signal Din, but in the MX voltage domain. Also, when the mode select signal is in the first or writing node, the control circuit 210 is configured to operate the second push-pull driver 230 to generate the second drive signal GDin_n at a complement logic level with respect to the input data signal Din, but in the MX voltage domain.

Figures 3A, 3B:
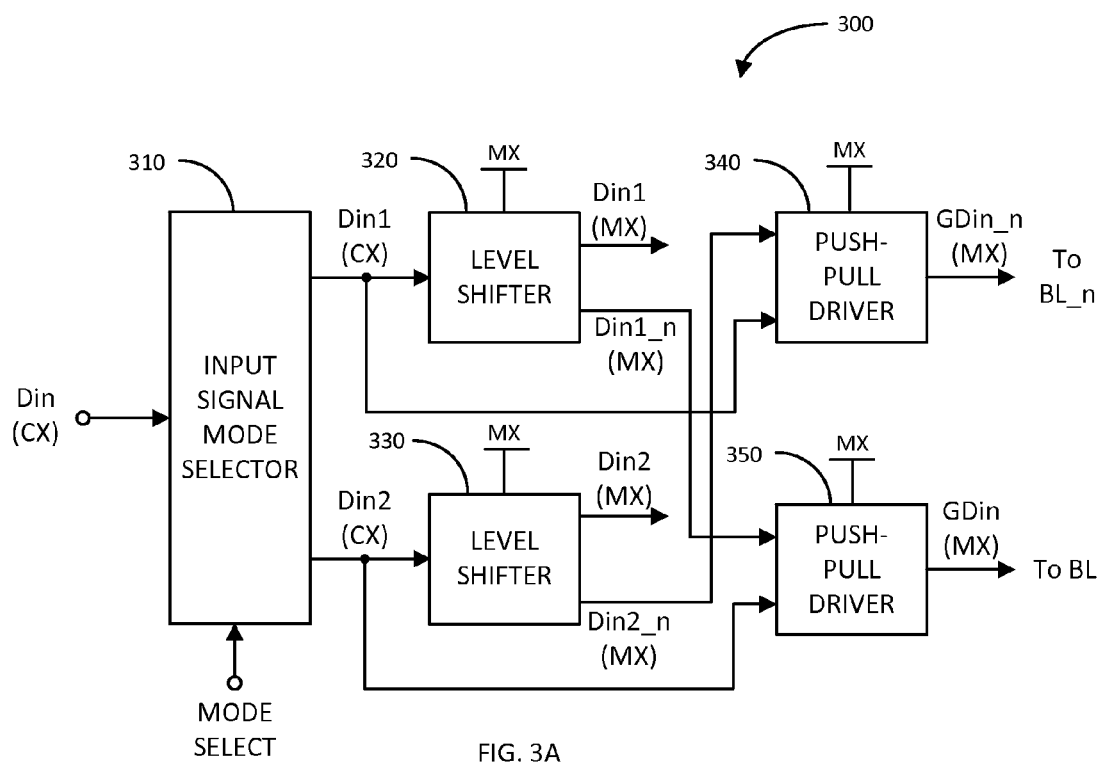
FIG. 3A illustrates a block diagram of another exemplary write driver for a memory circuit in accordance with another aspect of the disclosure.
FIG. 3B illustrates a table of exemplary signal states associated with an operation of the exemplary write driver of FIG. 3A in accordance with another aspect of the disclosure.

FIG. 3A illustrates a block diagram of another exemplary write driver 300 for a memory circuit in accordance with another aspect of the disclosure. The write driver 300 includes a more detailed exemplary implementation of the control circuit 210 previously discussed. In particular, the write driver 300 comprises a control circuit that includes an input signal mode selector 310, a first level shifter 320, and a second level shifter 330. The write driver 300 further comprises a first push-pull driver 340 including a first output node coupled to a corresponding complementary bit line BL_n of a memory circuit, and a second push-pull driver 350 including a second output node coupled to a corresponding bit line BL of the memory circuit.

The input signal mode selector 310 is configured to generate first and second intermediate signals Din1 and Din2 based on the input data signal Din and the mode select signal. The first and second intermediate signals Din1 and Din2 are in the same voltage domain CX as the input data signal Din. In response to the mode select signal being in the second or non-writing mode, the input signal mode selector 310 generates the first and second intermediate signals Din1 and Din2 at low logic levels, regardless of the value of the input data signal Din. In response to the mode select signal being in the first or writing mode, the input signal mode selector 310 generates the first intermediate signal Din1 at the same logic level as the input data signal Din, and the second intermediate signal Din2 at a complement logic level with respect to the input data signal Din.

The first level shifter 320 generates a first set of complementary control signals Din1 and Din1_n in the MX voltage domain based on the first intermediate signal Din1 (CX). The complementary control signal Din1 (MX) is at the same logic level as the first intermediate signal Din1 (CX), and the other complementary control signal Din1_n (MX) is at a complement logic level with respect to the first intermediate signal Din1 (CX). Note, that in this exemplary embodiment, the complementary control signal Din1 (MX) is not used.

Similarly, the second level shifter 330 generates a second set of complementary control signals Din2 and Din2_n in the MX voltage domain based on the second intermediate signal Din2. The complementary control signal Din2 (MX) is at the same logic level as the second intermediate signal Din2 (CX), and the other complementary control signal Din2_n (MX) is at a complement logic level with respect to the second intermediate signal Din2 (CX). Note, that in this exemplary embodiment, the complementary control signal Din2 (MX) is not used.

The first intermediate signal Din1 (CX) is coupled to a control input (e.g., gate) of a lower transistor (e.g., an n-channel FET) of the first push-pull driver 340. As discussed in more detail further herein, the lower transistor is coupled between the first output node and the ground or negative voltage rail of the first push-pull driver 340. The complementary control signal Din2_n (MX) generated by the second level shifter 330 is coupled to a control input (e.g., gate) of an upper transistor (e.g., a p-channel FET) of the first push-pull driver 340. As discussed in more detail further herein, the upper transistor is coupled between the positive voltage rail and the first output node of the first push-pull driver 340.

Similarly, the second intermediate signal Din2 (CX) is coupled to a control input (e.g., gate) of a lower transistor (e.g., an n-channel FET) of the second push-pull driver 350. In a similar manner, the lower transistor is coupled between the second output node and the ground or negative voltage rail of the second push-pull driver 350. The complementary control signal Din1_n (MX) generated by the first level shifter 320 is coupled to a control input (e.g., gate) of an upper transistor (e.g., a p-channel FET) of the second push-pull driver 350. In a similar manner, the upper transistor is coupled between the positive voltage rail and the second output node of the second push-pull driver 350. The detailed discussion of the operation of the write driver 300 follows with reference to a table depicted in FIG. 3B.

FIG. 3B illustrates a table of exemplary signal states associated with an operation of the write driver 300 in accordance with another aspect of the disclosure. When the mode select signal is in the second or the non-writing mode, the input signal mode selector 310 generates the first and second intermediate signals Din1 (CX) and Din2 (CX) at logic low levels regardless of the value of the input data signal Din, as depicted in the table. In response to the first and second intermediate signals Din1 (CX) and Din2 (CX) being at logic low levels, the first and second level shifters 320 and 330 generate the complementary control signals Din1_n (MX) and Din2_n (MX) at high logic levels, as depicted in the table.

In response to the high logic level of the complementary control signal Din2_n (MX) and the low logic level of the first intermediate signal Din1 (CX) being applied to the respective control inputs (e.g., gates) of the upper (e.g, p-channel FET) and lower (e.g., n-channel FET) transistors of the first push-push driver 340, both transistors do not conduct; and thereby, isolate the first output node from both the positive and the ground or negative voltage rails. Thus, the first output node is configured to float, as depicted in the table.

Similarly, in response to the high logic level of the complementary control signal Din1_n (MX) and the low logic level of the second intermediate signal Din2 (CX) being applied to the respective control inputs (e.g., gates) of the upper (e.g, p-channel FET) and lower (e.g., n-channel FET) transistors of the second push-push driver 350, both transistors do not conduct; and thereby, isolate the second output node from both the positive and the ground or negative voltage rails. Thus, the second output node is configured to float, as depicted in the table. Again, the first and second output nodes being configured to float during non-writing operations effectively isolates the write driver 300 from the corresponding bit lines BL_n and BL, respectively.

When the mode select signal is in the first or writing mode, the input signal mode selector 310 generates the first intermediate signal Din1 (CX) at the same logic level as the input data signal Din, and generates the second intermediate signal Din2 (CX) at a complement logic level with respect to the input data signal Din. Considering first the case when the input data signal Din is at a low logic level, the input signal mode selector 310 generates the first intermediate signal Din1 (CX) at a low logic level, and the second intermediate signal Din2 (CX) at a high logic level, as depicted in the table.

In response to the first intermediate signal Din1 (CX) being at a low logic level, the first level shifter 320 generates the complementary control signal Din1_n (MX) at a high logic level, as depicted in the table. In response to the second intermediate signal Din2 (CX) being at a high logic level, the second level shifter 330 generates the complementary control signal Din2_n (MX) at a low logic level, as depicted in the table.

In response to the low logic level of the complementary control signal Din2_n (MX) and the low logic level of the first intermediate signal Din1 (CX) being applied to the respective control inputs (e.g., gates) of the upper (e.g, p-channel FET) and lower (e.g., n-channel FET) transistors of the first push-push driver 340, the upper transistor conducts and the lower transistor does not conduct. The conduction of the upper transistor couples the positive voltage rail to the first output node, and the non-conduction of the lower transistor isolates the first output node from the ground or negative voltage rail. Thus, the first push-pull driver 340 generates the first drive signal GDin_n at a high logic level for the complementary bit line BL_n, as depicted in the table.

Similarly, in response to the high logic level of the complementary control signal Din1_n (MX) and the high logic level of the second intermediate signal Din2 (CX) being applied to the respective control inputs (e.g., gates) of the upper (e.g, p-channel FET) and lower (e.g., n-channel FET) transistors of the second push-push driver 350, the upper transistor does not conduct and the lower transistor conducts. The conduction of the lower transistor couples the ground or negative voltage rail to the second output node, and the non-conduction of the upper transistor isolates the second output node from the positive voltage rail. Thus, the second push-pull driver 350 generates the second drive signal GDin at a low logic level for the bit line BL, as depicted in the table.

Considering next the case when the input data signal Din is at a high logic level and the mode select signal is in the second or writing mode, the input signal mode selector 310 generates the first intermediate signal Din1 (CX) at a high logic level, and the second intermediate signal Din2 (CX) at a low logic level, as depicted in the table.

In response to the first intermediate signal Din1 (CX) being at a high logic level, the first level shifter 320 generates the complementary control signal Din1_n (MX) at a low logic level, as depicted in the table. In response to the second intermediate signal Din2 (CX) being at a low logic level, the second level shifter 330 generates the complementary signal Din2_n (MX) at a high logic level, as depicted in the table.

In response to the high logic level of the complementary control signal Din2_n (MX) and the high logic level of the first intermediate signal Din1 (CX) being applied to the respective control inputs (e.g., gates) of the upper (e.g, p-channel FET) and lower (e.g., n-channel FET) transistors of the first push-push driver 340, the upper transistor does not conduct and the lower transistor conducts. The conduction of the lower transistor couples the ground or negative voltage rail to the first output node, and the non-conduction of the upper transistor isolates the first output node from the positive voltage rail. Thus, the first push-pull driver 340 generates the first drive signal GDin_n at a low logic level for the complementary bit line BL_n, as depicted in the table.

Similarly, in response to the low logic level of the complementary control signal Din1_n (MX) and the low logic level of the second intermediate signal Din2 (CX) being applied to the respective control inputs (e.g., gates) of the upper (e.g, p-channel FET) and lower (e.g., n-channel FET) transistors of the second push-push driver 350, the upper transistor conducts and the lower transistor does not conduct. The conduction of the upper transistor couples the positive voltage rail to the second output node, and the non-conduction of the lower transistor isolates the second output node from the ground or negative voltage rail. Thus, the second push-pull driver 350 generates the second drive signal GDin at a high logic level for the bit line BL, as depicted in the table.

Figures 4A, 4B:
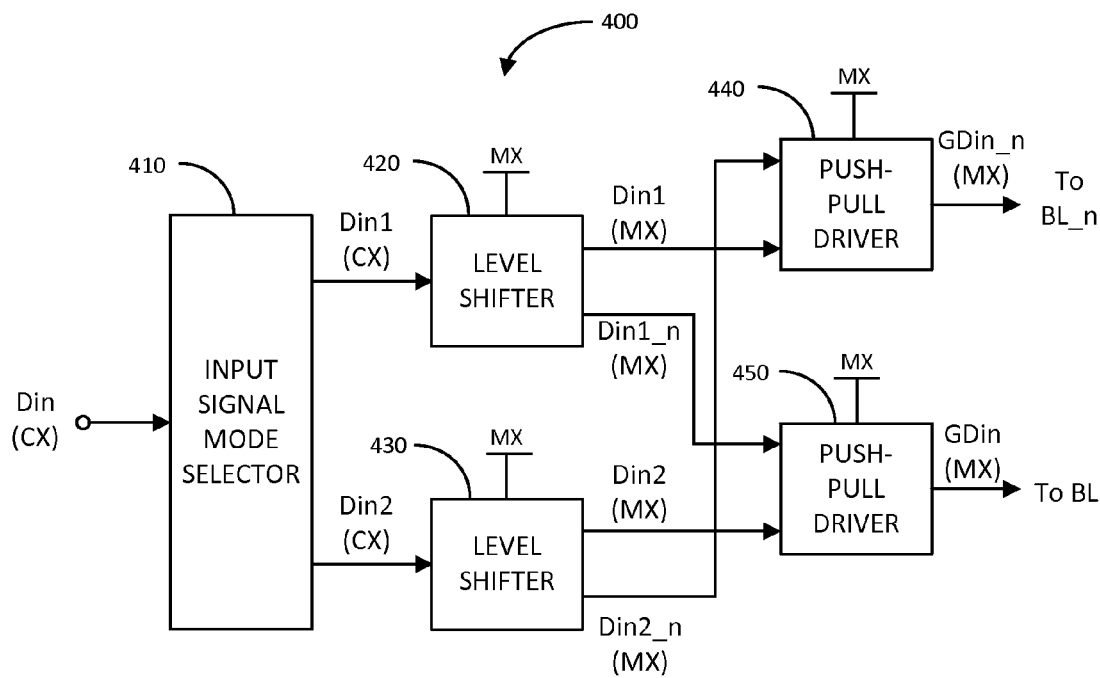
FIG. 4A illustrates a block diagram of yet another exemplary write driver for a memory circuit in accordance with another aspect of the disclosure.
FIG. 4B illustrates a table of exemplary signal states associated with an operation of the exemplary write driver of FIG. 4A in accordance with another aspect of the disclosure.

FIG. 4A illustrates a block diagram of yet another exemplary write driver 400 for a memory circuit in accordance with another aspect of the disclosure. The write driver 400 is similar to that of write driver 300, and includes substantially the same elements, namely an input signal mode selector 410, first level shifter 420, second level shifter 430, first push-pull driver 440, and second push-pull driver 450. The write driver 400 differs from write driver 300, in that instead of the first and second intermediate signals Din1 (CX) and Din2 (CX) being applied to the respective control inputs of the lower transistors of the first and second push-pull drivers 440 and 450, the complementary control signals Din1 (MX) and Din2 (MX) are applied to the respective control inputs of the lower transistors of the first and second push-pull drivers 440 and 450. Since the signals Din1 (MX) and Din2 (MX) are at the same logic levels as the signals Din1 (CX) and Din2 (CX) for both modes, the first and second push-pull drivers 440 and 450 are operated in substantially the same manner. The table depicted in FIG. 4B summarizes the signal states for the various operations of the write driver 400.

Figure 5:
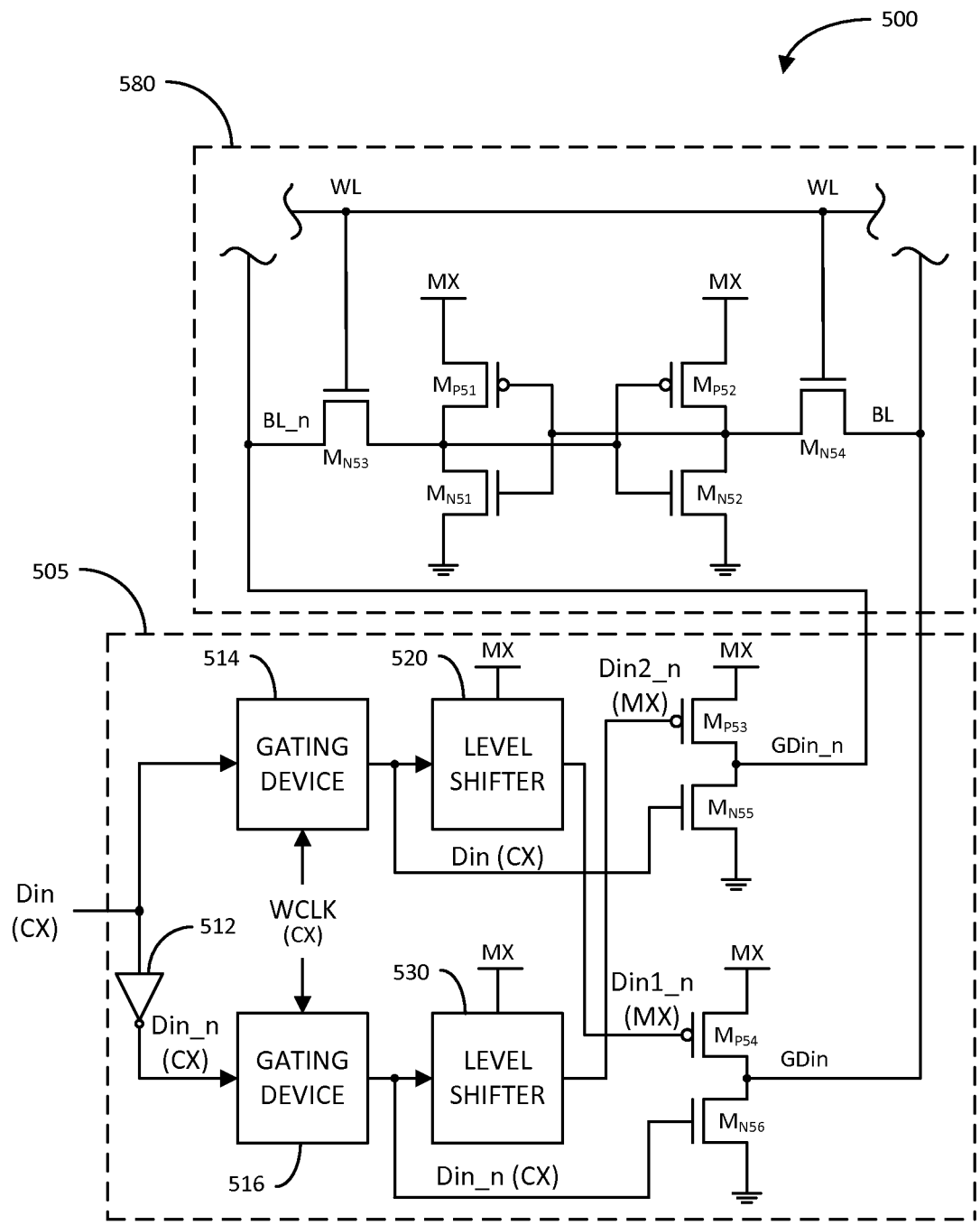
FIG. 5 illustrates a block diagram of still another exemplary write driver for a memory circuit in accordance with another aspect of the disclosure.

FIG. 5 illustrates a schematic diagram of a portion of an exemplary memory device 500 in accordance with another aspect of the disclosure. The memory device 500 comprises at least one memory cell 580 and at least one corresponding write driver 505. In this example, the at least one memory cell 580 is configured as an SRAM memory cell, and includes p-channel FETs $M_{P51}$ and $M_{P52}$ and n-channel FETs $M_{N51}$ and $M_{N52}$ configured as a latch circuit. The at least one memory cell 580 comprises access FETs $M_{N53}$ and $M_{N54}$ coupled between corresponding bit lines BL_n and BL and the latch circuit. The gates of the access FETs $M_{N53}$ and $M_{N54}$ are coupled to a corresponding word line WL.

The write driver 505 comprises an inverter 512, first and second gating devices 514 and 516, first and second level shifters 520 and 530, and first and second push-pull drivers comprising p- and n-channel FETs $M_{P53}$ and FET $M_{N55}$ and p- and n-channel FETs $M_{P54}$ and FET $M_{N56}$, respectively. The first gating device 514 is configured to gate an input data signal Din in a voltage domain CX to an input of the first level shifter 520 and to the gate of FET $M_{N55}$ of the first push-pull driver in response to an asserted level of a write clock signal WCLK in the voltage domain CX. Similarly, the second gating device 516 is configured to gate the complement of the input data signal Din, e.g., Din_n, in the voltage domain CX to an input of the second level shifter 530 and to the gate of FET $M_{N56}$ of the second push-pull driver in response to the asserted level of the write clock signal WCLK.

The circuit including the first and second gating devices 514 and 516 and the inverter 512 is an exemplary implementation of an input signal mode selector previously discussed. The gated input data signal Din (CX) and the gated complement input data signal Din_n (CX) are examples of the first and second intermediate signals previously discussed. The write clock signal WCLK is an exemplary implementation of the mode select signal previously discussed. That is, the write clock signal being at an asserted level translates to the mode select signal being in the first or writing mode. The write clock signal being at a non-asserted level translates to the mode select signal being in the second or non-writing mode.

The first level shifter 520 is configured to generate a first set of complementary control signals Din1 and Din1_n in a memory voltage domain MX based on the gated input data signal Din in the voltage domain CX. In this example, the control signal Din1 (MX) of the first level shifter 520 is not used, and thus, it is not shown. The control signal Din1_n (MX) of the first level shifter 520 is applied to the gate of FET $M_{P54}$ of the second push-pull driver. Similarly, the second level shifter 530 is configured to generate a second set of complementary control signals Din2 and Din2_n in the voltage domain MX based on the gated complementary input data signal Din_n in the voltage domain CX. In this example, the control signal Din2 (MX) of the second level shifter 530 is not used, and thus, it is not shown. The control signal Din2_n (MX) of the second level shifter 530 is applied to the gate of FET $M_{P53}$ of the first push-pull driver.

The FETs $M_{P53}$ and $M_{N55}$ of the first push-pull driver are coupled in series between the positive voltage rail MX and ground or negative voltage rail. The drains of FETs $M_{P53}$ and $M_{N55}$ are coupled to the complementary bit line BL_N of the corresponding at least one memory cell 580. Accordingly, the drive signal GDin_n for the complementary bit line BL_n is generated at the drains of FETs $M_{P53}$ and $M_{N55}$. Similarly, the FETs $M_{P54}$ and $M_{N56}$ of the second push-pull driver are coupled in series between the positive voltage rail MX and ground or negative voltage rail. The drains of FETs $M_{P54}$ and $M_{N56}$ are coupled to the bit line BL of the corresponding at least one memory cell 580. Accordingly, the drive signal GDin for the bit line BL is generated at the drains of FETs $M_{P54}$ and $M_{N56}$.

In operation, when the input data signal Din is at a low logic level, the first gating device 514 gates the low logic level to the input of the first level shifter 520 and to the gate of FET $M_{N55}$ of the first push-pull driver in response to the asserted level of the write clock signal WCLK. In response to the gated input data signal Din being at a low logic level, the first level shifter 520 generates a high logic level control signal Din1_n in the MX domain, which is applied to the gate of FET $M_{P54}$ of the second push-pull driver. At substantially the same time, the second gating device 516 gates the high logic level of the complementary input data signal Din_n to the input of the second level shifter 530 and to the gate of FET $M_{N56}$ of the second push-pull driver in response to the asserted level of the write clock signal WCLK. In response to the gated complementary input data signal Din_n being at a high logic level, the second level shifter 530 generates a low logic level control signal Din2_n in the MX domain, which is applied to the gate of FET $M_{P53}$ of the first push-pull driver.

Thus, when the input data signal Din is at the low logic level, the first push-pull driver generates the drive signal GDin_n at a high logic level because FET $M_{P53}$ is turned on and FET $M_{N55}$ is turned off. Additionally, the second push-pull driver generates the drive signal GDin at a low logic level for drive signal BL because FET $M_{P54}$ is turned off and FET $M_{N56}$ is turned on. By way of the bit lines BL_n and BL and the corresponding word line WL being asserted, the drive signals GDin_n and GDin write a logic low data to the at least one memory cell 580, which corresponds to the low logic level of the input data signal Din.

Similarly, when the input data signal Din is at a high logic level, the first gating device 514 gates the high logic level to the input of the first level shifter 520 and to the gate of FET $M_{N55}$ of the first push-pull driver in response to the asserted level of the write clock signal WCLK. In response to the gated input data signal Din being at a high logic level, the first level shifter 520 generates a low logic level control signal Din1_n in the MX domain, which is applied to the gate of FET $M_{P54}$ of the second push-pull driver. At substantially the same time, the second gating device 516 gates the low logic level of the complementary input data signal Din_n to the input of the second level shifter 530 and to the gate of FET $M_{N56}$ of the second push-pull driver in response to the asserted level of the write clock signal WCLK. In response to the gated complementary input data signal Din_n being at a low logic level, the second level shifter 530 generates a high logic level control signal Din2 in the MX domain, which is applied to the gate of FET $M_{P53}$ of the first push-pull driver.

Thus, when the input data signal Din is at the high logic level, the first push-pull driver generates the drive signal GDin_n at a low logic level because FET $M_{P53}$ is turned off and FET $M_{N55}$ is turned on. On the other hand, the second push-pull driver generates the drive signal GDin at a high logic level because FET $M_{P54}$ is turned on and FET $M_{N56}$ is turned off. By way of the bit lines BL_n and BL and the corresponding word line WL being asserted, the drive signals GDin_n and GDin write a logic high data to the at least one memory cell 580, which corresponds to the high logic level of the input data signal Din.

When the write clock signal WCLK is in a non-asserted level, the first and second gating devices 514 and 516 output low logic levels. In response to the low logic levels, the first and second level shifters 520 and 530 generate the control signals Din1_n and Din2_n at high logic levels. The low logic levels being applied to the gates of FETs $MN_{55}$ and $MN_{56}$ cause these FETs to not conduct, and the high logic levels applied to the gate of FETs $MP_{53}$ and $MP_{54}$ cause these FETs to also not conduct. Thus, when the write clock signal WCLK is in the non-asserted level, the output nodes of the first and second push-pull drivers are floating since they are not electrically coupled to the positive nor the ground or negative voltage rail. This produces a high impedance at the output nodes of the first and second push-pull drivers, which effectively isolates the write driver 505 from the at least one memory cell 580.

Figure 6A:
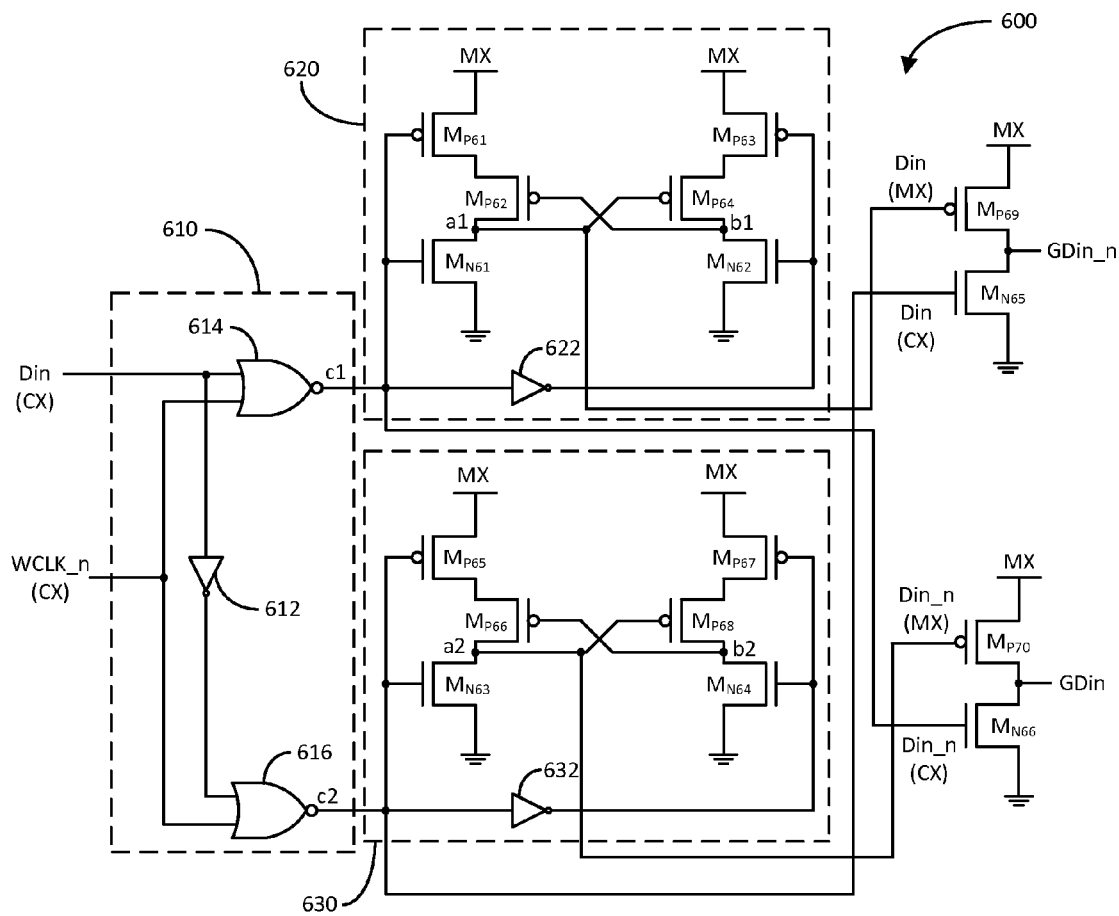
FIG. 6A illustrates a block diagram of an additional exemplary write driver for a memory circuit in accordance with another aspect of the disclosure.

FIG. 6A illustrates a schematic diagram of an exemplary write driver 600 in accordance with another aspect of the disclosure. The write driver 600 comprises an input signal mode selector 610, a first level shifter 620, a second level shifter 630, a first push-pull driver comprising p-channel FET $M_{P69}$ and n-channel FET $M_{N65}$, and a second push-pull driver comprising p-channel FET $M_{P70}$ and n-channel FET $M_{N66}$.

The input signal mode selector 610 comprises NOR gates 614 and 616, and inverter 612. An input data signal Din in a circuit voltage domain (CX) is applied to one of the inputs of NOR gate 614 and to an input of inverter 612. The output of inverter 612 is coupled to one of the inputs of NOR gate 616. A complementary clock signal WCLK_n is applied to the other respective inputs of NOR gates 614 and 616. In response to the write clock signal WCLK_n being driven to a low logic level, the input signal mode selector 610 gates the input data signal Din at the output of NOR gate 616 (e.g., at node c2), and gates the complementary input data signal Din_n at the output of NOR gate 614 (e.g., at node c1). The output of NOR gate 614 is coupled to the input of the first level shifter 620 and to the gate of FET $M_{N66}$ of the second push-pull driver. The output of NOR gate 616 is coupled to the input of the second level shifter 630 and the gate of FET $M_{N65}$ of the first push-pull driver.

The first level shifter 620 comprises p-channel FETs $M_{P61}$ and $M_{P62}$, and n-channel FET $M_{N61}$ coupled in series between a memory voltage rail MX and ground. The first level shifter 620 further comprises p-channel FETs $M_{P63}$ and $M_{P64}$, and n-channel FET $M_{N62}$ coupled in series between the memory voltage rail MX and ground. The drains of FETs $M_{P62}$ and $M_{N61}$ at node a1 are coupled to the gate of FET $M_{P64}$ and to the gate of FET $M_{P69}$ of the first push-pull driver. The drains of FETs $M_{P64}$ and $M_{N62}$ at node b1 are coupled to the gate of FET $M_{P62}$. The first level shifter 620 further comprises an inverter 622 including an input coupled to the gates of FETs $M_{P61}$ and $M_{N61}$ and to the output of NOR gate 614, and an output coupled to the gates of FETs $M_{P63}$ and $M_{N62}$.

Similarly, the second level shifter 630 comprises p-channel FETs $M_{P65}$ and $M_{P66}$, and n-channel FET $M_{N63}$ coupled in series between the memory voltage rail MX and ground. The second level shifter 630 further comprises p-channel FETs $M_{P67}$ and $M_{P68}$, and n-channel FET $M_{N64}$ coupled in series between the memory voltage rail MX and ground. The drains of FETs $M_{P66}$ and $M_{N63}$ at node a2 are coupled to the gate of FET $M_{P68}$ and to the gate of FET $M_{P70}$ of the second push-pull driver. The drains of FETs $M_{P68}$ and $M_{N64}$ at node b2 are coupled to the gate of FET $M_{P66}$. The second level shifter 630 further comprises an inverter 632 including an input coupled to the gates of FETs $M_{P65}$ and $M_{N63}$ and to the output of NOR gate 616, and an output coupled to the gates of FETs $M_{P67}$ and $M_{N64}$.

The FETs $M_{P69}$ and $M_{N65}$ of the first push-pull driver are coupled in series between the memory voltage rail MX and ground. A drive signal BL_n for a complementary bit line BL_n is generated at the drains of FETs $M_{P69}$ and $M_{N65}$. Similarly, the FETs $M_{P70}$ and $M_{N66}$ of the second push-pull driver are coupled in series between the memory voltage rail MX and ground. The drive signal BL for a corresponding bit line BL is generated at the drains of FETs $M_{P70}$ and $M_{N66}$.

Figure 6B:
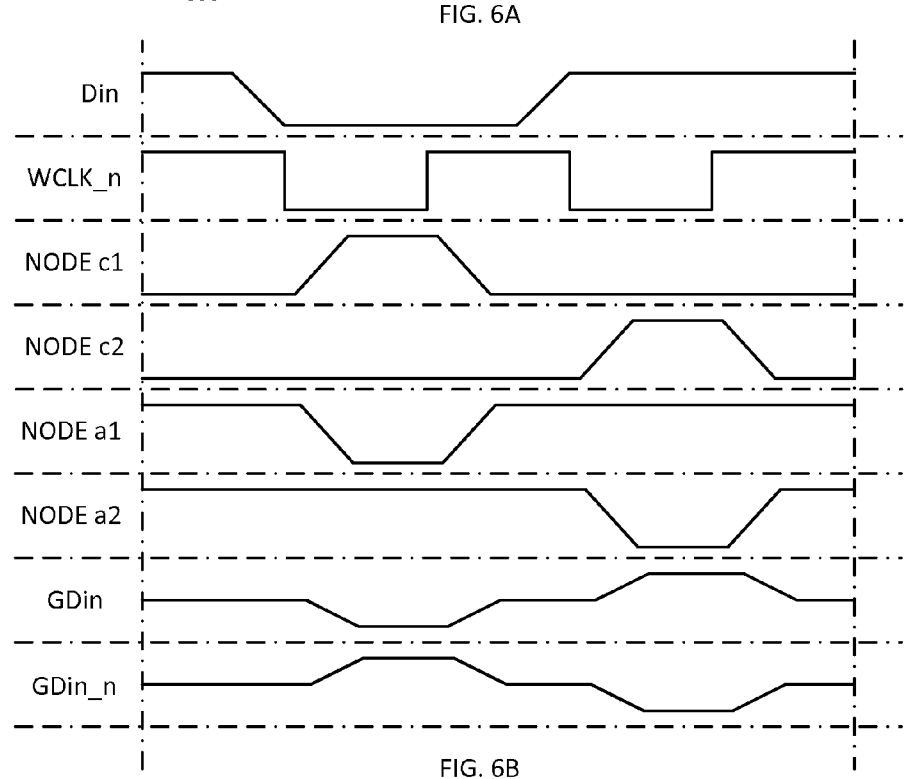
FIG. 6B illustrates a timing diagram of exemplary signals associated with an operation of the exemplary write driver of FIG. 6A in accordance with another aspect of the disclosure.

FIG. 6B illustrates a timing diagram of signals associated with the operation of the write driver 600 in accordance with another aspect of the disclosure. When the complementary write clock signal WCLK_n is at the non-asserted high logic level, the NOR gates 614 and 616 both generate low logic signals irrespective of the value of the input data signal Din. The low logic levels at the outputs of NOR gates 614 and 616, being applied to the gates of FETs $M_{N65}$ and $M_{N66}$, cause these FETs $M_{N65}$ and $M_{N66}$ to not conduct. Also, in response to the low logic levels at the outputs of NOR gates 614 and 616, the first and second level shifters 620 and 630 generate high logic levels at similarly-situated nodes a1 and a2. The high logic levels at nodes a1 and a2, being applied to the gates of FETs $M_{P69}$ and $M_{P70}$, cause these FETs $M_{P69}$ and $M_{P70}$ to not conduct. Thus, when the complementary write clock signal WCLK_n is at the non-asserted high logic level, all FETs of the first and second push-pull drivers are turned off. This causes the output nodes of the push-pull drivers to float, and substantially isolate the write driver 600 from the at least one memory cell.

When the input data signal Din is at a low logic level, the input signal mode selector 610 gates the low logic level of the input data signal Din to the output of NOR gate 616 (node c2), and the high logic level of the complementary input data signal Din_n to the output of NOR gate 614 (node c1) in response to an asserted low logic level of the complementary write clock signal WCLK_n. Since the output of the NOR gate 616 was already at a low logic level, the FETs $M_{N65}$ and $M_{P70}$ continue to not conduct. In other words, as shown in the timing diagram, the voltages at the nodes c2 and a2 remain unchanged, and thus, FETs $M_{N65}$ and $M_{P70}$ continue to not conduct.

The high logic level at the output of NOR gate 614 causes FET $M_{N66}$ to conduct, and causes the first level shifter 620 to generate a low logic level at node a1. The low logic level at node a1, being applied to the gate of FET $M_{P69}$, causes FET $M_{P69}$ to conduct. Thus, the first push-pull driver generates the drive signal GDin_n at a high logic level and the second push-pull driver generates the drive signal GDin at a low logic level in response to the input data signal Din being gated at a low logic level. By way of bit lines BL_n and BL, the first and second push-pull driver write data based on the input data signal Din to the corresponding at least one memory cell. When the complementary write clock signal is de-asserted again, the first and second push-pull drivers are configured to float their output nodes to substantially isolate the write driver 600 from the at least one memory cell.

When the input data signal Din is at a high logic level, the input signal mode selector 610 gates the high logic level of the input data signal Din to the output of NOR gate 616 (node c2), and the low logic level of the complementary input data signal Din_n to the output of NOR gate 614 (node c1) in response to an asserted low logic level of the complementary write clock signal WCLK_n. Since the output of the NOR gate 614 was already at a low logic level, the FETs $M_{N66}$ and $M_{P69}$ continue to not conduct. In other words, as shown in the timing diagram, the voltages at the nodes c1 and a1 remain unchanged, and thus, FETs $M_{N66}$ and $M_{P69}$ remain not conducting.

The high logic level at the output of NOR gate 616 causes FET $M_{N65}$ to conduct, and causes the second level shifter 630 to generate a low logic level at node a2. The low logic level at node a2, being applied to the gate of FET $M_{P70}$, causes FET $M_{P70}$ to conduct. Thus, the first push-pull driver generates the drive signal GDin_n at a low logic level and the second push-pull driver generates the drive signal GDin at a high logic level in response to the input data signal Din being gated at a high logic level. By way of bit lines BL_n and BL, the first and second push-pull driver write data based on the input data signal Din to the corresponding at least one memory cell. When the complementary write clock signal is de-asserted again, the first and second push-pull drivers are configured to float their output nodes to substantially isolate the write driver 600 from the at least one memory cell.

As discussed, the p-channel FETs $M_{P69}$ and $M_{P70}$ of the first and second push-pull drivers are responsive to voltages at the similarly-situated nodes a1 and a2 within the first and second level shifters 620 and 630, respectively. Similarly, the n-channel FETs $M_{N65}$ and $M_{N66}$ of the first and second push-pull drivers are responsive to voltages at the similarly-situated nodes c1 and c2 at the inputs of the first and second level shifters 630 and 620, respectively. Thus, because these transistors are responsive to similarly-situated nodes, the transistors are operated in a substantially symmetrical timewise manner. Additionally, since the p-channel FETs $M_{P69}$ and $M_{P70}$ are configured for writing data in response to the voltages at a1 and a2 being brought to a low logic level, the writing of data to the memory array is substantially fast because it only requires the turning on of n-channel FETs $M_{N61}$ and $M_{N63}$, which may be performed in a relatively fast manner.

Figure 7:
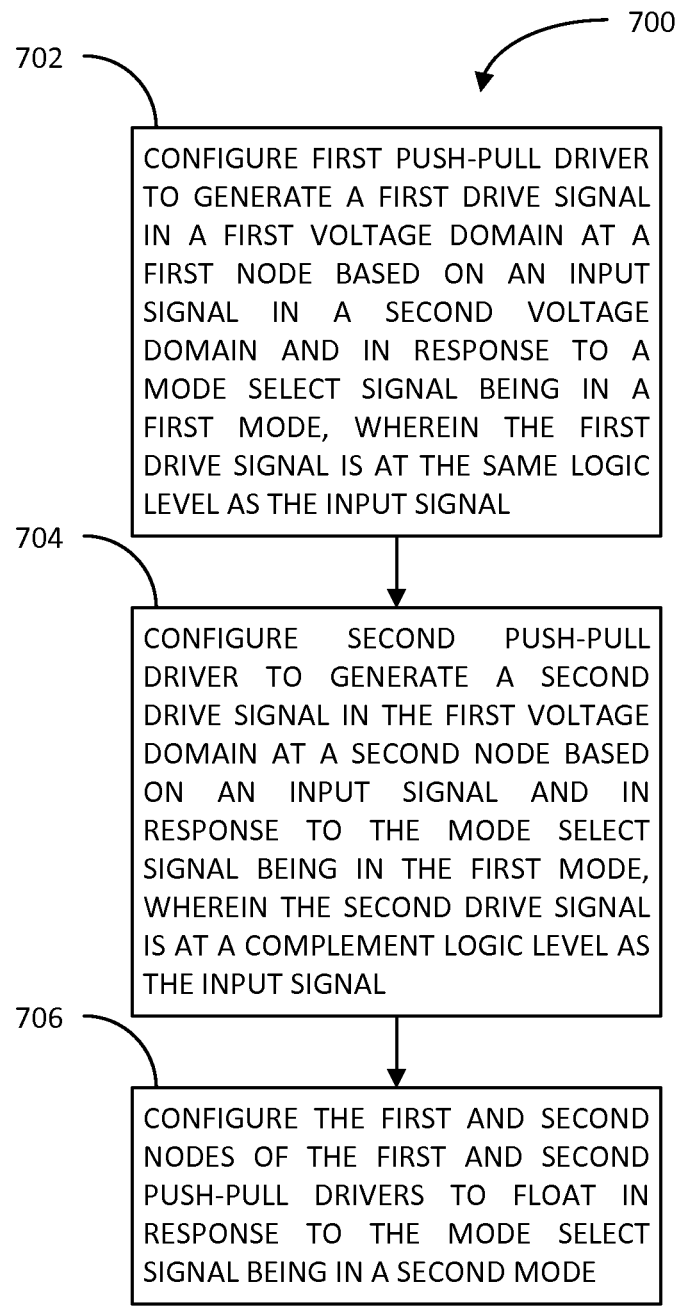
FIG. 7 illustrates a flow diagram of an exemplary method of operating first and second push-pull drivers of an exemplary write driver in accordance with another aspect of the disclosure.

FIG. 7 illustrates a flow diagram of an exemplary method 700 of operating a write driver for a memory circuit in accordance with another aspect of the disclosure. The method 700 may be performed by any of the exemplary write drivers described herein. The method 700 comprises configuring a first push-pull driver to generate a first drive signal in a first voltage domain at a first node based on an input signal in a second voltage domain, and in response to a mode select signal being in a first mode (block 702). The first drive signal may be at the same logic level as the input signal.

The method 700 further comprises configuring a second push-pull driver to generate a second drive signal in the first voltage domain at a second node based on the input signal and the mode select signal being in the first mode (block 704). The second drive signal may be at a complement logic level with respect to the input signal. Further, the method 700 comprises configuring the first and second nodes of the first and second push-pull drivers to float based on the mode select signal being in a second mode (block 706).

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using another structure, functionality, or structure and functionality in addition to or other than one or more of the aspects set forth herein. As an example of some of the above concepts, in some aspects concurrent channels may be established based on pulse repetition frequencies. In some aspects concurrent channels may be established based on pulse position or offsets. In some aspects concurrent channels may be established based on time hopping sequences. In some aspects concurrent channels may be established based on pulse repetition frequencies, pulse positions or offsets, and time hopping sequences.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Also, it should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise a set of elements comprises one or more elements. In addition, terminology of the form "at least one of A, B, or C" or "one or more of A, B, or C" or "at least one of the group consisting of A, B, and C" used in the description or the claims means "A or B or C or any combination of these elements."

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

Those of skill in the art understand that information and signals may be represented using any of a variety of different technologies and techniques. For example, any data, instructions, commands, information, signals, bits, symbols, and chips referenced throughout the above description may be represented by voltages, currents, electromagnetic waves, magnetic fields or particles, optical fields or particles, or any combination thereof.

Those of skill would further appreciate that the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processor may be responsible for managing the bus and general processing, including the execution of software stored on the machine-readable media. The processor may be implemented with one or more general-purpose and/or special-purpose processors. Examples include microprocessors, microcontrollers, DSP processors, and other circuitry that can execute software. Software shall be construed broadly to mean instructions, data, or any combination thereof, whether referred to as software, firmware, middleware, microcode, hardware description language, or otherwise. Machine-readable media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product. The computer-program product may comprise packaging materials.

In a hardware implementation, the machine-readable media may be part of the processing system separate from the processor. However, as those skilled in the art will readily appreciate, the machine-readable media, or any portion thereof, may be external to the processing system. By way of example, the machine-readable media may include a transmission line, a carrier wave modulated by data, and/or a computer product separate from the wireless node, all which may be accessed by the processor through the bus interface. Alternatively, or in addition, the machine-readable media, or any portion thereof, may be integrated into the processor, such as the case may be with cache and/or general register files.

A processing system may include hardware, software, firmware or any combination thereof. The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

The machine-readable media may comprise a number of software modules. The software modules include instructions that, when executed by the processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

If implemented in software, the functions may be stored or transmitted over as one or more instructions or code on a computer-readable medium. Computer-readable media include both computer storage media and communication media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. In some aspects, a computer-readable medium comprises codes executable to perform one or more operations as taught herein. For certain aspects, the computer program product may include packaging material.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the scope of the disclosure. Thus, the present disclosure is not intended to be limited to the aspects shown herein but is to be accorded the widest scope consistent with the principles and novel features disclosed herein.

What is claimed is:
1. An apparatus, comprising:
  a first push-pull driver;
  a second push-pull driver; and
  a control circuit configured to:
    operate the first push-pull driver to generate a first drive signal in a first voltage domain at a first node based on an input signal and in response to a mode select signal being in a first mode,
      wherein the input signal is in a second voltage domain,
      wherein the first drive signal is at a same logic level as the input signal, and
      wherein the first push-pull driver is responsive to a first driver control signal in the first voltage domain and a second driver control signal in the second voltage domain, wherein a voltage in the first voltage domain is a level shifted voltage from a voltage in the second voltage domain;
    operate the second push-pull driver to generate a second drive signal in the first voltage domain at a second node based on the input signal and in response to the mode select signal being in the first mode,
      wherein the second drive signal is at a complement logic level with respect to the input signal, and
      wherein the second push-pull driver is responsive to a third driver control signal in the first voltage domain and a fourth driver control signal in the second voltage domain; and
    operate the first and second push-pull drivers to float the first and second nodes in response to the mode select signal being in a second mode.

2. The apparatus of claim 1, wherein the first push-pull driver comprises a first transistor and a second transistor coupled in series between a first voltage rail and a second voltage rail, wherein the first node is situated between the first and second transistors, and wherein the first and second transistors comprise first and second control inputs, respectively.

3. The apparatus of claim 2, wherein the second push-pull driver comprises a third transistor and a fourth transistor coupled in series between the first voltage rail and the second voltage rail, wherein the second node is situated between the third and fourth transistors, and wherein the third and fourth transistors comprise third and fourth control inputs, respectively.

4. The apparatus of claim 3, wherein the first and third transistors are p-channel field effect transistors (FETs) and the second and fourth transistors are n-channel FETs, and wherein the first, second, third and fourth control inputs are the gates of the first, second, third, and fourth transistors, respectively.

5. The apparatus of claim 3, wherein the control circuit comprises:
  a first level shifter configured to generate a first set of complementary control signals in the first voltage domain, comprising the first driver control signal, based on a first intermediate signal in the second voltage domain, comprising the fourth driver control signal, wherein the first intermediate signal is at the same logic level as the input signal in response to the mode select signal being in the first mode, wherein the first intermediate signal is at a low logic level in response to the mode select signal being in the second mode, and wherein one of the first set of complementary control signals that is at a complement logic level with respect to the first intermediate signal is coupled to the first control input of the first transistor; and
  a second level shifter configured to generate a second set of complementary control signals in the first voltage domain, comprising the third driver control signal, based on a second intermediate signal in the second voltage domain, comprising the second driver control signal, wherein the second intermediate signal is at a complement logic level with respect to the input signal in response to the mode select signal being in the first mode, wherein the second intermediate signal is at a low logic level in response to the mode select signal being in the second mode, and wherein one of the second set of complementary control signals that is at a complement logic level with respect to the second intermediate signal is coupled to the third control input of the third transistor.

6. The apparatus of claim 5, wherein the first intermediate signal is coupled to the fourth control input of the fourth transistor, and wherein the second intermediate signal is coupled to the second control input of the second transistor.

7. The apparatus of claim 5, wherein the control circuit comprises an input signal mode selector configured to:
generate the first intermediate signal based on the input signal and the mode select signal; and
generate the second intermediate signal based on the input signal and the mode select signal.

8. The apparatus of claim 7, wherein the input signal mode selector comprises:
an inverter configured to generate a complement of the input signal;
a first gating device configured to:
generate the first intermediate signal by gating and inverting the complement input signal in response to the mode select signal being in the first mode;
generate the first intermediate signal at a low logic level in response to the mode select signal being in the second mode; and
a second gating device configured to:
generate the second intermediate signal by gating and inverting the input signal in response to the mode select signal being in the first mode;
generate the second intermediate signal at a low logic level in response to the mode select signal being in the second mode.

9. The apparatus of claim 8, wherein the first and second gating devices comprise first and second NOR-gates, respectively.

10. The apparatus of claim 1, wherein the first and second nodes of the first and second push-pull drivers are coupled to complementary bit lines of a memory circuit.

11. The apparatus of claim 10, wherein the mode select signal comprises a write clock signal for timely controlling a writing of data to the memory circuit.

12. A method of operating first and second push-pull drivers, comprising:
configuring the first push-pull driver to generate a first drive signal in a first voltage domain at a first node based on an input signal and in response to a mode select signal being in a first mode,
wherein the input signal is in a second voltage domain,
wherein the first drive signal is at a same logic level as the input signal, and
wherein the first push-pull driver is responsive to a first driver control signal in the first voltage domain and a second driver control signal in the second voltage domain, wherein a voltage in the first voltage domain is a level shifted voltage from a voltage in the second voltage domain;
configuring the second push-pull driver to generate the second drive signal in the first voltage domain at a second node based on the input signal and in response to the mode select signal being in the first mode,
wherein the second drive signal is at a complement logic level with respect to the input signal, and
wherein the second push-pull driver is responsive to a third driver control signal in the first voltage domain and a fourth driver control signal in the second voltage domain; and
configuring the first and second push-pull drivers to float the first and second nodes in response to the mode select signal being in a second mode.

13. The method of claim 12, wherein the first push-pull driver comprises a first transistor and a second transistor coupled in series between a first voltage rail and a second voltage rail, wherein the first node is situated between the first and second transistors, and wherein the first and second transistors comprise first and second control inputs, respectively.

14. The method of claim 13, wherein the second push-pull driver comprises a third transistor and a fourth transistor coupled in series between the first voltage rail and the second voltage rail, wherein the second node is situated between the third and fourth transistors, and wherein the third and fourth transistors comprise third and fourth control inputs, respectively.

15. The method of claim 14, wherein the first and third transistors are p-channel field effect transistors (FETs) and the second and fourth transistors are n-channel FETs, and wherein the first, second, third and fourth control inputs are the gates of the first, second, third, and fourth transistors, respectively.

16. The method of claim 14,
wherein configuring the first push-pull driver comprises:
generating a first set of complementary control signals in the first voltage domain, comprising the first driver control signal, based on a first intermediate signal in the second voltage domain, comprising the fourth driver control signal, wherein the first intermediate signal is at the same logic level as the input signal in response to the mode select signal being in the first mode, wherein the first intermediate signal is at a low logic level in response to the mode select signal being in the second mode, and wherein one of the first set of complementary control signals that is at a complement logic level with respect to the first intermediate signal is coupled to the first control input of the first transistor; and
wherein configuring the second push-pull driver comprises:
generating a second set of complementary control signals in the first voltage domain, comprising the third driver control signal, based on a second intermediate signal in the second voltage domain, comprising the fourth driver control signal, wherein the second intermediate signal is at a complement logic level with respect to the input signal in response to the mode select signal being in the first mode, wherein the second intermediate signal is at a low logic level in response to the mode select signal being in the second mode, and wherein one of the second set of complementary control signals that is at a complement logic level with respect to the second intermediate signal is coupled to the third control input of the third transistor.

17. The method of claim 16, wherein configuring the first push-pull driver further comprises applying the second intermediate signal to the second control input of the second transistor, and wherein configuring the second push-pull driver further comprises applying the first intermediate signal to the fourth control input of the fourth transistor.

18. The method of claim 16, further comprising:
generating the first intermediate signal based on the input signal and the mode select signal; and
generating the second intermediate signal based on the input signal and the mode select signal.

19. The method of claim 18, wherein generating the first intermediate signal comprises:
inverting the input signal to generate a complement of the input signal;
gating and inverting the complement input signal to form the first intermediate signal in response to the mode select signal being in the first mode; and
generating a low logic level to form the first intermediate signal in response to the mode select signal being in the second mode.

20. The method of claim 18, wherein generating the second intermediate signal comprises:
gating and inverting the input signal to form the second intermediate signal in response to the mode select signal being in the first mode; and
generating a low logic level to form the second intermediate signal in response to the mode select signal being in the second mode.

21. The method of claim 12, further comprising applying the first and second drive signals to complementary bit lines of a memory circuit.

22. The method of claim 21, wherein the mode select signal comprises a write clock signal for timely controlling a writing of data to the memory circuit.

23. An apparatus, comprising:
means for generating a first drive signal in a first voltage domain at a first node based on an input signal and in response to a mode select signal being in a first mode, wherein the input signal is in a second voltage domain, wherein the first drive signal is at a same logic level as the input signal, and
wherein the means for generating the first drive signal is responsive to a first driver control signal in the first voltage domain and a second driver control signal in the second voltage domain, wherein a voltage in the first voltage domain is a level shifted voltage from a voltage in the second voltage domain;
means for generating a second drive signal in the first voltage domain at a second node based on the input signal and in response to the mode select signal being in the first mode,
wherein the second drive signal is at a complement logic level with respect to the input signal, and
wherein the means for generating the second drive signal is responsive to a third driver control signal in the first voltage domain and a fourth driver control signal in the second voltage domain, and
wherein the means for generating the first drive signal and the means for generating the second drive signal float the first and second nodes in response to the mode select signal being in a second mode.

24. The apparatus of claim 23, wherein the means for generating the first drive signal comprises a first transistor and a second transistor coupled in series between a first voltage rail and a second voltage rail, wherein the first node is situated between the first and second transistors, and wherein the first and second transistors comprise first and second control inputs, respectively.

25. The apparatus of claim 24, wherein the means for generating the second drive signal comprises a third transistor and a fourth transistor coupled in series between the first voltage rail and the second voltage rail, wherein the second node is situated between the third and fourth transistors, and wherein the third and fourth transistors comprise third and fourth control inputs, respectively.

26. The apparatus of claim 25, wherein the first and third transistors are p-channel field effect transistors (FETs) and the second and fourth transistors are n-channel FETs, and wherein the first, second, third and fourth control inputs are the gates of the first, second, third, and fourth transistors, respectively.

27. The apparatus of claim 24, further comprising:
means for generating a first set of complementary control signals in the first voltage domain, comprising the first driver control signal, based on a first intermediate signal in the second voltage domain, comprising the fourth driver control signal, wherein the first intermediate signal is at the same logic level as the input signal in response to the mode select signal being in the first mode, wherein the first intermediate signal is at a low logic level in response to the mode select signal being in the second mode, and wherein one of the first set of complementary control signals that is at a complement logic level with respect to the first intermediate signal is coupled to the first control input of the first transistor; and
means for generating a second set of complementary control signals in the first voltage domain, comprising the third driver control signal, based on a second intermediate signal in the second voltage domain, comprising the second driver control signal, wherein the second intermediate signal is at a complement logic level with respect to the input signal in response to the mode select signal being in the first mode, wherein the second intermediate signal is at a low logic level in response to the mode select signal being in the second mode, and wherein one of the second set of complementary control signals that is at a complement logic level with respect to the second intermediate signal is coupled to a third control input of a third transistor.

28. The apparatus of claim 27, wherein the first intermediate signal is coupled to a fourth control input of a fourth transistor, and wherein the second intermediate signal is coupled to the second control input of the second transistor.

29. The apparatus of claim 27, further comprising:
means for generating the first intermediate signal based on the input signal and the mode select signal; and
means for generating the second intermediate signal based on the input signal and the mode select signal.

30. The apparatus of claim 29, wherein the means for generating the first intermediate signal comprises:
means for inverting the input signal to generate a complement input signal;
means for gating and inverting the complement input signal to form the first intermediate signal in response to the mode select signal being in the first mode; and
means for generating a low logic level to form the first intermediate signal in response to the mode select signal being in the second mode.

31. The apparatus of claim 29, wherein the means for generating the second intermediate signal comprises:
means for gating and inverting the input signal to form the second intermediate signal in response to the mode select signal being in the first mode; and
means for generating a low logic level to form the second intermediate signal in response to the mode select signal being in the second mode.

32. The apparatus of claim 23, further comprising means for storing data, wherein the first and second drive signals are coupled to complementary bit lines of the means for storing data.

33. The apparatus of claim 32, wherein the mode select signal comprises a write clock signal for timely controlling a writing of data to the means for storing data.

* * * * *